United States Patent [19]

Matsushita et al.

[11] Patent Number: 5,071,776
[45] Date of Patent: * Dec. 10, 1991

[54] WAFER PROCESSSING METHOD FOR MANUFACTURING WAFERS HAVING CONTAMINANT-GETTERING DAMAGE ON ONE SURFACE

[75] Inventors: Yoshiaki Matsushita, Yokohama; Moriya Miyashita, Kitakami; Makiko Wakatsuki, Yokohama; Norihiko Tsuchiya, Tokyo; Atsuko Kubota, Yokohama, all of Japan

[73] Assignee: Kabushiki Kaisha Toshiba, Kawasaki, Japan

[*] Notice: The portion of the term of this patent subsequent to Nov. 20, 2007 has been disclaimed.

[21] Appl. No.: 275,866

[22] Filed: Nov. 25, 1988

[30] Foreign Application Priority Data

Nov. 28, 1987 [JP] Japan .................. 62-300421

[51] Int. Cl.$^5$ .................. H01L 21/309; H01L 21/463
[52] U.S. Cl. .................. 437/10; 437/946; 134/1; 134/2; 134/3
[58] Field of Search .................. 134/1, 2, 3, 184; 437/9, 10, 946

[56] References Cited

U.S. PATENT DOCUMENTS

| | | | |
|---|---|---|---|
| 4,144,099 | 3/1979 | Edmonds | 437/10 |
| 4,276,114 | 6/1981 | Takano | 437/10 |
| 4,902,350 | 2/1990 | Steck | 139/1 |
| 4,971,920 | 11/1990 | Miyashita et al. | 937/10 |
| 4,980,300 | 12/1990 | Miyashita et al. | 437/10 |

FOREIGN PATENT DOCUMENTS

| | | | |
|---|---|---|---|
| 55-1114 | 1/1980 | Japan | 437/9 |
| 55-121644 | 9/1980 | Japan | 437/10 |
| 56-60022 | 5/1981 | Japan | 437/9 |
| 60-47427 | 3/1985 | Japan | 437/10 |
| 63-32938 | 2/1988 | Japan | 437/10 |

OTHER PUBLICATIONS

Wolf et al., *Silicon Processing for the VLSI Era*, Lattice Press, Sunset Beach, Calif. (1986), p. 519.
*Journal of Electrochemistry Sty.* vol. 127, No. 9, Sep. 1980 pp. 2058-1062.
Patent Abstracts of Japan, vol. 9, No. 240 (E-345) [1963].
VLSI Process data Handbook, Toru Hara et al., 1982, pp. 271-274.

*Primary Examiner*—Olik Chaudhuri
*Assistant Examiner*—Ourmazd S. Ojan
*Attorney, Agent, or Firm*—Finnegan, Henderson, Farabow, Garrett, and Dunner

[57] ABSTRACT

First, silicon wafers are formed by cutting silicon monocrystalline ingot into slices. Then back side and main surfaces of the wafers are subjected to lapping and etching processes. Next, the wafers are submerged into substantially pure water and ultrasonic waves are applied to the wafer surface via the water to clean at least one of the surfaces of each of the wafers and form gettering damage on the wafer surface. After this, the main surfaces of the wafers which have been subjected to the cleaning and damage-forming process and on which semiconductor elements are to be formed are polished into mirror finish.

14 Claims, 8 Drawing Sheets

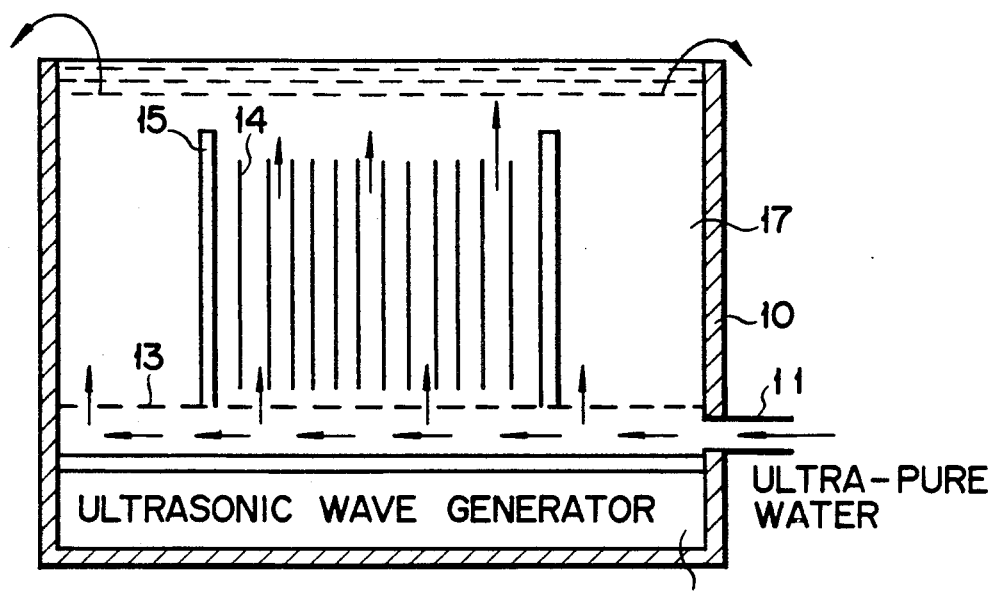
F I G. 2
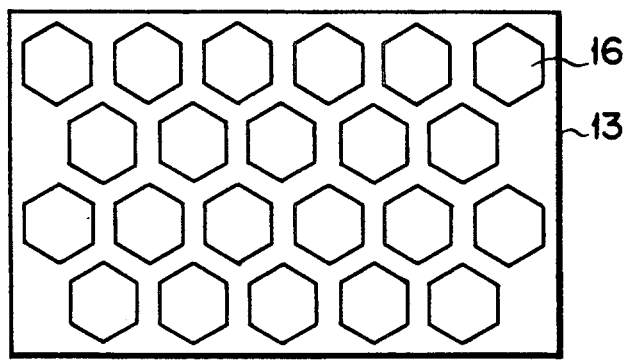
F I G. 3A
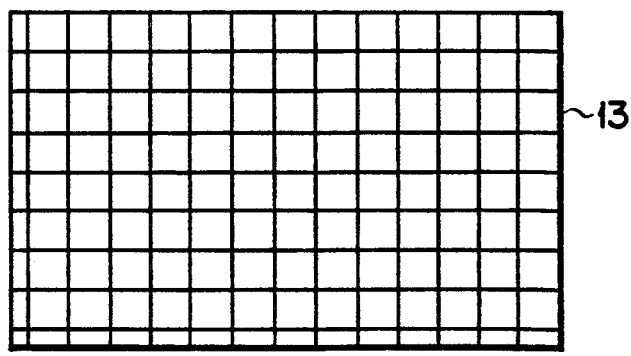
F I G. 3B

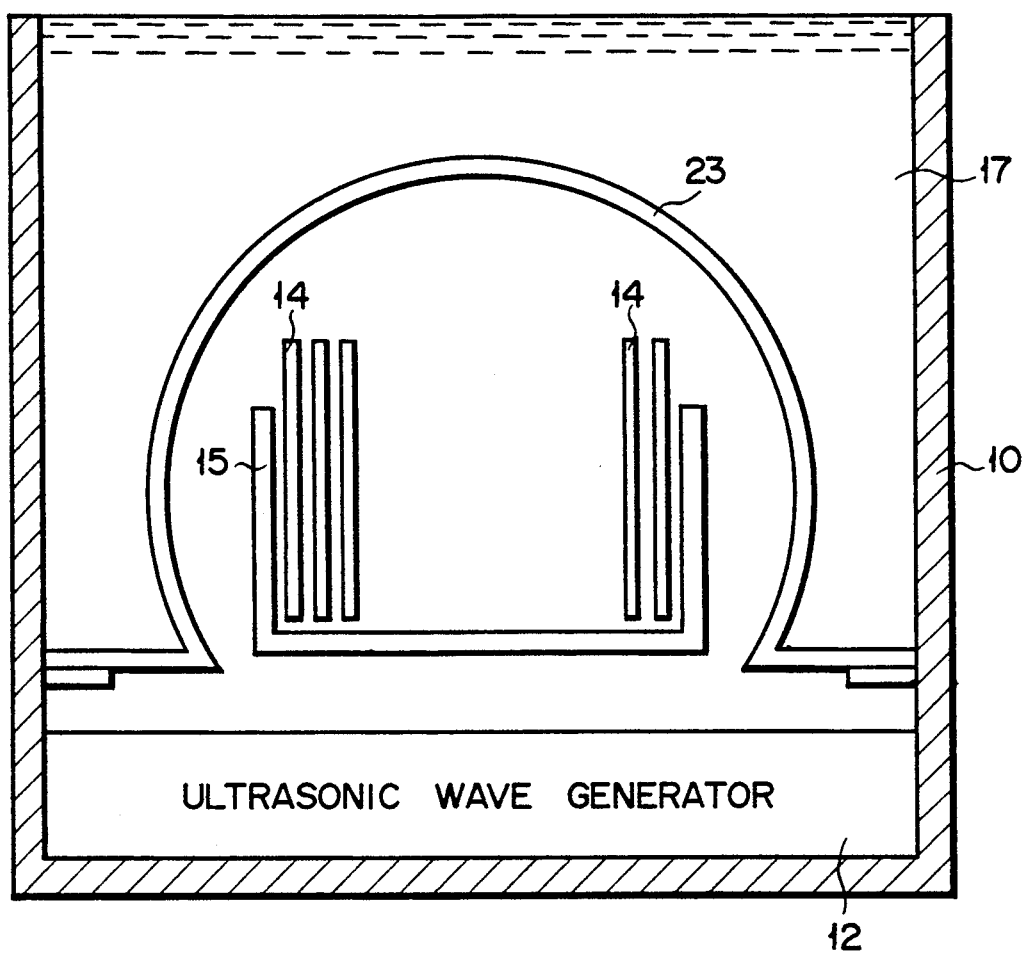
F I G. 10

ULTRA-PURE WATER

ULTRA-PURE WATER →

WAFER PROCESSSING METHOD FOR MANUFACTURING WAFERS HAVING CONTAMINANT-GETTERING DAMAGE ON ONE SURFACE

BACKGROUND OF THE INVENTION

1. Field of the Invention

This invention relates to a wafer processing method, and more particularly to a wafer processing method for manufacturing wafers which have material-contaminant-gettering damage formed on one surface.

2. Description of the Related Art

Wafers used for the manufacture of semiconductor devices are formed as follows: First, a silicon monocrystalline ingot is sliced into wafers. Thereafter, both surfaces of each wafer are subjected to lapping and etching processes and damage is formed only on the back side surface (which is the side opposite to the main surface in which semiconductor elements are formed in the later steps) by means of honing. After this, the wafer is cleaned and the main surface, in which semiconductor elements are formed, is polished to a mirror finish.

The reason for using honing to form damage is as follows: As the semiconductor device is formed with higher integration density and is more miniaturized, requirements for a high quality become stronger. It is well known in the art that a wafer is formed to have gettering capability by forming damage on the back side surface thereof in order to attain a wafer of high quality. A honing method is known as a method for forming the back side damage (BSD) or damage on the back side surface of the wafer. The honing method is effected by spraying fine particles such as $SiO_2$ onto the back side surface of the wafer to form damage thereon. However, with this method, damages of as large as several $\mu m$ may to be formed, and if a wafer with such large damages is subjected to a device manufacturing process such as an oxidation process, silicon dust will be produced from the damages and attached as fine particles to the main surface of the wafer. Due to that contamination, a significant effect occurs in the fine pattern processing, lowering the manufacturing yield.

With the wafer having no BSD formed on the back side surface, the above problem does not occur. However, in this case, the wafer has no gettering capability and therefore the main surface of the wafer is easily influenced by accidental process fluctuation or contamination. For example, in the oxidation step, an oxidation induced stacking fault (OSF) may occur in the surface. As a result, leakage current flowing across the pn junction increases or image defect will occur in an image sensor, thus lowering the manufacturing yield.

As described above, in the conventional wafer processing method of forming wafers having damages formed on the back side surface thereof, the damage site size becomes too large, degrading the process to be effected later.

SUMMARY OF THE INVENTION

An object of this invention is to provide a wafer processing method by which fine gettering damages can be formed on the back side surface of the wafer, thus causing no influence on the succeeding process and in which the process can be simplified in comparison with the conventional method.

According to one embodiment of this invention, there is provided a wafer processing method which comprises the steps of forming wafers by cutting a semiconductor monocrystalline ingot into slices; subjecting back side and main surfaces of the wafer to lapping and etching processes; and submerging the wafer in a treatment solution, preferably water, propagating ultrasonic waves on the wafer surface via the treatment solution to clean at least one of the surfaces of the wafer and forming gettering damage on the wafer surface.

With this processing method, the ultrasonic wave propagating in the treatment solution strikes the wafer surface to form fine damage on the wafer surface, and the fine damage is used as back side damage. Further, at the time of forming the damage, the wafer surface is cleaned.

Thus, according to this invention, a wafer processing method can be provided by which sufficiently fine gettering damage can be formed on the back side surface of the wafer, thus causing no adverse effect on the succeeding process and in which the process can be simplified in comparison with the conventional method.

DESCRIPTION OF THE DRAWINGS

FIG. 2 is a front view of a first constructional example of a treatment device used to effect the processing method shown in FIG. 1;

FIGS. 3A and 3B are each a diagram of an example of a support which can be used to support wafers in the treatment device shown in FIG. 2;

FIG. 10 is a front view of a fifth constructional example of a treatment device used to effect the processing method shown in FIG. 1;

FIG. 13 is a flowchart showing a wafer processing method according to a second embodiment of this invention.

Detailed Description of the Preferred Embodiments

Figure 1:
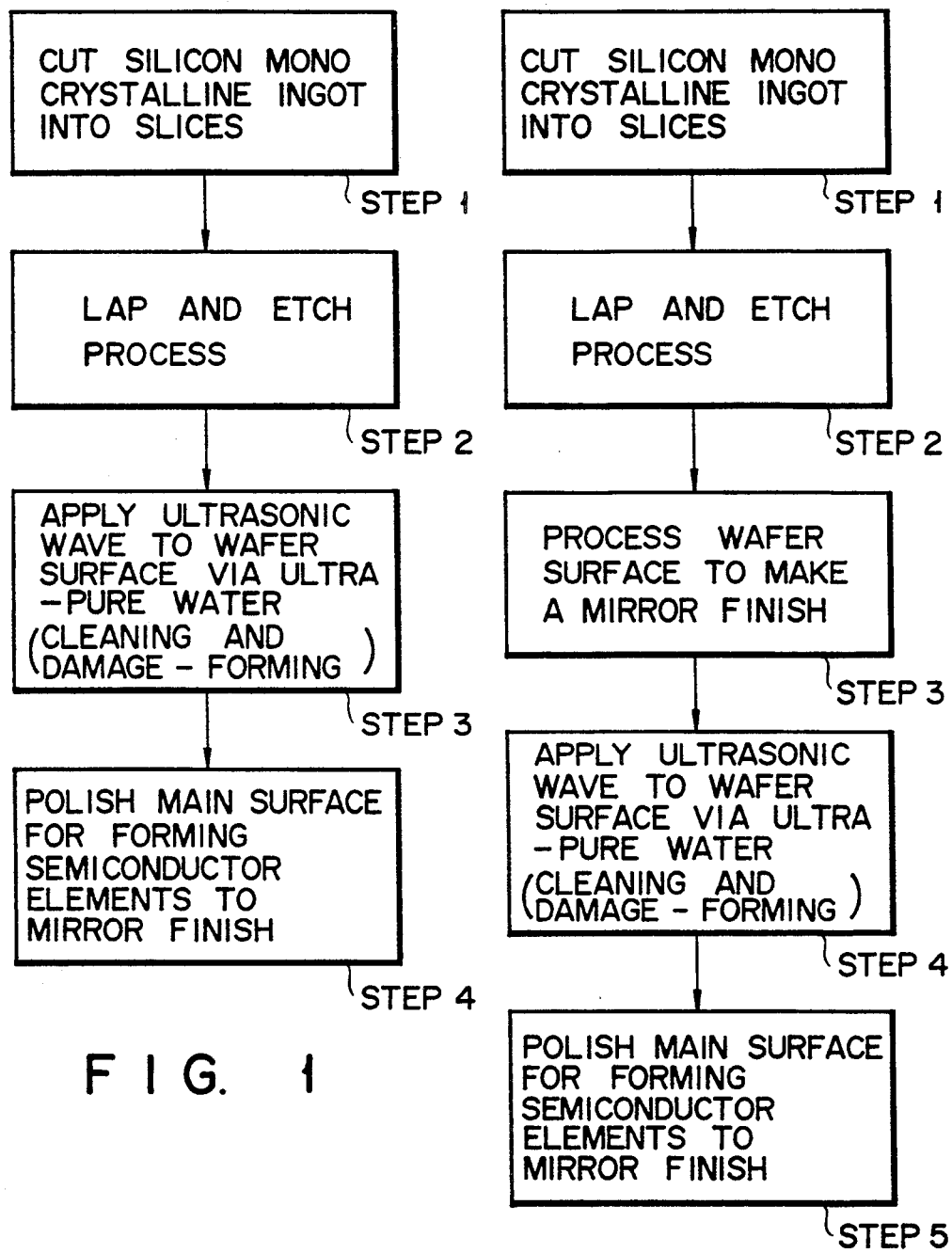
FIG. 1 is a flowchart showing a wafer processing method according to one embodiment of this invention.

FIG. 1 is a flowchart showing a wafer processing method according to one embodiment of this invention is sliced into wafers (STEP 1). Thereafter, both sides of each wafer are subjected to lapping and etching processes, to remove surface defect caused by the slicing operation (STEP 2). After this, each wafer is submerged in a treatment solution or in ultra-pure water, and is subjected to ultrasonic waves which clean and form damage on both wafer surfaces (STEP 3). Upon completion of this step, the main surface of the wafer, in which semiconductor elements are to be formed, is polished to a mirror finish.

FIG. 2 is a front view of a first constructional example of a treatment device used to effect the above cleaning and damage formation step (STEP 3). Referring to FIG. 2, treatment bath 10 is shown with a portion thereof cut out in order to clearly illustrate its internal structure. Pure or ultra-pure water 17 enters the bottom portion of treatment bath 10 via supply port 11, and is caused to overflow from bath 10 to ensure a continuous flow of water into bath 10. Ultrasonic wave generator 12, including an ultrasonic oscillator and an ultrasonic wave diaphragm, is disposed on the bottom portion of treatment bath 10, and transmits ultrasonic waves into water 17. Support 13, which has a number of openings, is situated in treatment bath 10, above supply port 11. A plurality of wafers 14 to be cleaned are placed in wafer carrier 15 which is located on support 13.

To effect the cleaning and damage-forming operation, ultrasonic wave generator 12 is operated with treatment bath 10 filled with water 17. The ultrasonic wave output power of wave generator 12 is set to be in the range of 50W to 500W and the frequency thereof in the range of 10 KHz to 100 KHz, because it is difficult to form damage on the wafer if the frequency is outside the above range, while if the output power is set to greater than 500W, large-sized damage will be formed and large scars will remain in the surface of the wafer. Ultrasonic waves propagate in water 17 and strike wafers 14, causing fine damages to be formed on both sides of each wafer and, at the same time cleaning the wafer surfaces.

Support 13 is either a plate having hexagonal openings 16 as is shown in FIG. 3A, or a mesh as is shown in FIG. 3B. It supports wafer carrier 15. Ultra-pure water is supplied upward to wafer carrier 15 through support 13, and circulates within bath 10. Since the ultra-pure water keeps flowing within bath 10, it washes away the particles coming off during the process of forming damage. Hence, all particles are washed away from the surface of wafer 14, and are subsequently removed from bath 10, along with a portion of the water, as fresh water is continuously supplied into bath 10.

After the above cleaning and damage formation operation is completed, the main surface of each wafer in which semiconductor elements are to be formed is cleaned again and polished (STEP 4) to a mirror finish.

The inventors formed two batches of semiconductor wafers having a diameter of 5 inches. The wafers of the first batch were made by the conventional method, wherein the wafers were oxidized at 1000° C. for 16 hours in a dry oxygen atmosphere. Those of the second batch were made by the method according to the invention, which has been described above. Then, the inventors evaluated the rate of generation of fine particles, with regard to both batches of wafers. In the case of the first-batch wafers, it was found that particles with a diameter of 0.3 μm to 0.5 μm adhered to the surface of each wafer, at a density of 100 to 1000 cm$^{-2}$. In the case of the second-batch wafers, it was found that fine particles adhered to the surface of each wafer at a density of 10 cm$^{-2}$. These findings indicate that the rate of generation of fine particles is greatly suppressed in the case of the wafers formed by the method of the present invention. This is because the wafers manufactured this way are continuously cleaned with pure or ultra-pure water, thereby reducing the incidence of adhesion of particles to the wafer surfaces.

Further, the inventors manufactured two batches of wafers, both by two methods according to the invention. In the first method, ultrasonic waves of various frequencies ranging from 5 KHz to 500 KHz were applied to the wafers, while using a constant power of 200W. In the second method, ultrasonic waves of a constant frequency of 38 KHz were applied to the wafers, while using different output powers ranging from 10W to 1000W. In either method, after the ultrasonic waves had been applied to the wafers, the wafers were oxidized at 1000° C. for 16 hours in an dry oxygen atmosphere. The inventors measured the density of OSF (oxidation-induced stacking fault) appearing on the front surface (i.e., the main surface, polished to a mirror finish in STEP 4) and on the back surface of each wafer.

Figure 4:
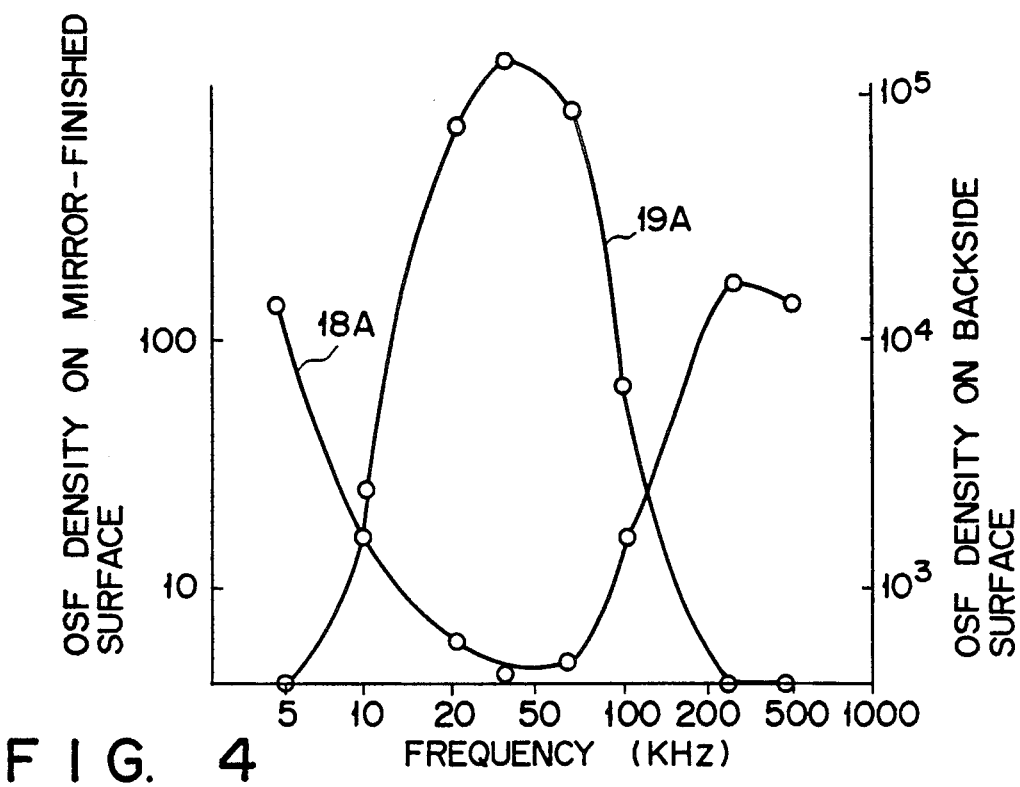
FIG. 4 is a characteristic diagram showing the relation between the frequency of ultrasonic waves and OSF density.

FIG. 4 shows the result of measurement of OSF density obtained in a case where the frequency was changed while the ultrasonic output power was set at 200 W. In this figure, characteristic curve 18A indicates the OSF density on the front surface, while characteristic curve 19A indicates OSF density on the back surface. As is clearly seen from FIG. 4, it was difficult to form damages at a frequency lower than 10 KHz or higher than 100 KHz, inevitably increasing the OSF density on the mirror surface and lowering the gettering capability.

Figure 5:
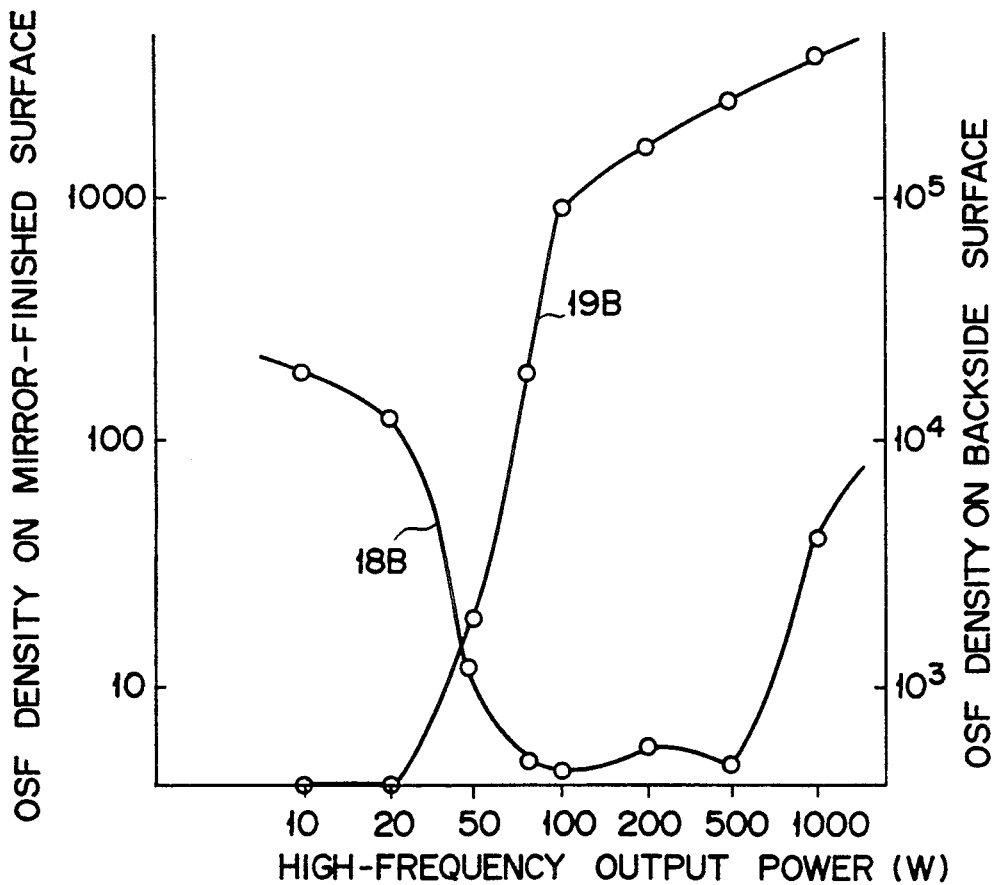
FIG. 5 is a characteristic diagram showing the relation between the output POWER of ultrasonic waves and OSF density.

FIG. 5 shows the result of measuring the OSF density obtained in a case where ultrasonic wave output was changed with the frequency set at 38 KHz. In FIG. 5, characteristic curve 18B indicates the OSF density on the mirror-finished surface, and characteristic curve 19B indicates the OSF density on the back side surface. As is clearly seen from FIG. 5, no damage was formed on the back side surface when the output was lower than 50W, and large damages were formed when the output was higher than 500W. In this case, the large damages could not be eliminated by polishing to increase the OSF density on the mirror-finished surface.

Therefore, in order to form a wafer which has the gettering capability on the back side surface and no defects on the main surface, and in which no fine particles are formed, it is preferable to set the frequency of ultrasonic wave applied to wafers 14 in the range of 10 KHz to 100 KHz and set the output power thereof in the range of 50W to 500W.

As described above, according to the processing method of the above embodiment, fine gettering damage can be formed on the back side surface and the number of fine particles attached to the wafer can be suppressed to a minimum. Therefore, no substantial adverse effect occurs in the succeeding semiconductor element manufacturing process. Further, according to the method of the above embodiment, since the cleaning and damage formation operation can be effected at the same time, the process can be simplified in comparison with the conventional method.

Figure 6:
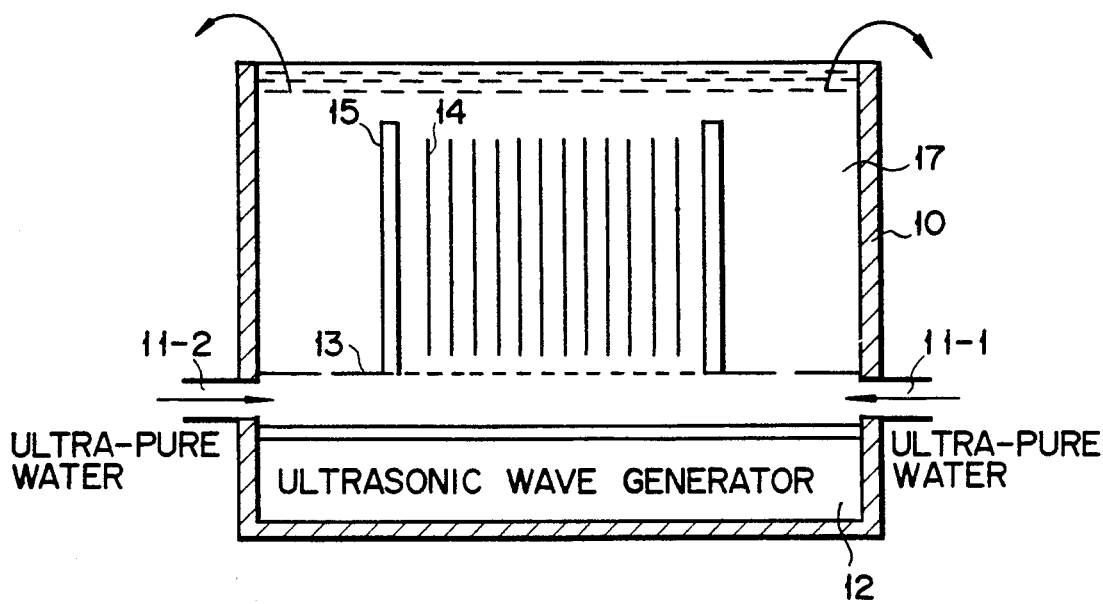
FIG. 6 is a front view of a second constructional example of a treatment device used to effect the processing method shown in FIG. 1.

FIG. 6 is a front view showing a second construction example of a treatment device used in STEP 3 shown in FIG. 1. In the treatment device, supply ports 11-1 and 11-2 for supplying ultra-pure water 17 into treatment bath 10 are formed in two positions of the bottom portion of bath 10 so as to attain more effective replacement of ultra-pure water 17 in bath 10. As in FIG. 2, in order to clearly show the internal structure of treatment bath 10, bath 10 is shown with a part thereof being cut away in FIG. 6, and the same portions to those in FIG. 2 are denoted by the same reference numerals.

In the treatment device shown in FIGS. 2 and 6, support 13 is provided, wafer carrier 15 is disposed on support 13, and ultra-pure water 17 is supplied into a gap between ultrasonic wave generator 12 and support 13. As a result, it becomes possible to effectively prevent fine particles from being attached again to wafer 14 in comparison with a case where wafer carrier 15 is directly disposed on ultrasonic wave generator 12.

Figure 7:
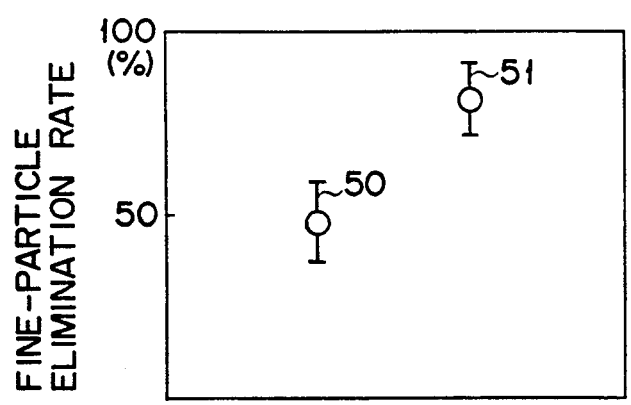
FIG. 7 is a graph showing a particle elimination rate recorded when a support was used, and also a particle elimination rate recorded when a support is not used.

FIG. 7 is a diagram showing fine particle elimination rates in cases where support 13 is provided and where no support is provided in the treatment device shown in FIGS. 2 and 6. In FIG. 7, characteristic curve 50 shows the case where no support is provided and characteristic curve 51 shows the case where the support is provided. As is clearly seen from FIG. 7, the fine particle elimination rate can be significantly improved by providing the support.

Figure 8:
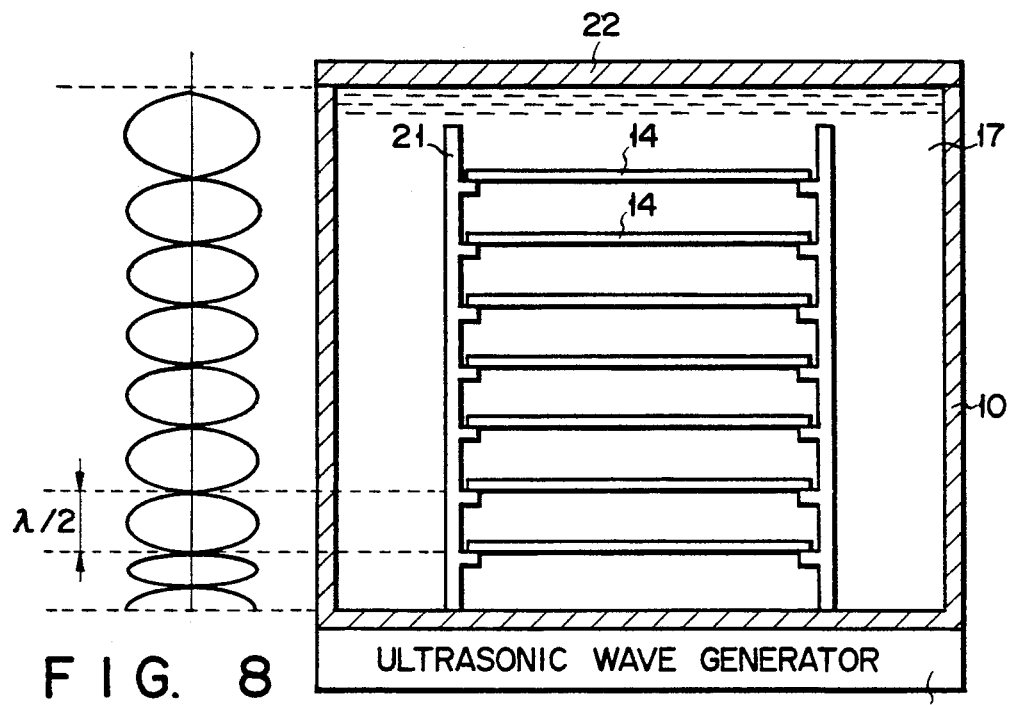
FIG. 8 is a front view of a third constructional example of a treatment device used to effect the processing method shown in FIG. 1.

FIG. 8 is a front view showing a third constructional example of a treatment device used to effect STEP 3 of the processing method shown in FIG. 1. In order to clearly show the internal structure of treatment bath 10, bath 10 is partly cut away in FIG. 8. In the treatment device, wafer carrier 21 in which a plurality of wafers 14 are horizontally arranged is disposed in treatment bath 10, and reflection plate 22 for reflecting ultrasonic wave is disposed in the upper portion of bath 10. Further, the interval between wafers 14 disposed in wafer carrier 21 is set to be equal to period λ/2 of an ultrasonic standing wave which is shown in FIG. 8 and which is generated from ultrasonic wave generator 12 to propagate in ultra-pure water 17. In this case, the position of wafers 14 in wafer carrier 21 is adjusted so that the back side surfaces of wafers 14 may correspond to nodes of the standing wave. For example, if the frequency of the ultrasonic wave used is set to 100 KHz and the sound speed in the ultrapure water is $1.5 \times 10^3$ (m/sec), period λ/2 of the ultrasonic standing wave becomes 7.5 mm. That is, in this case, the wafers are disposed at an interval of 7.5 mm in wafer carrier 21.

Figure 9:
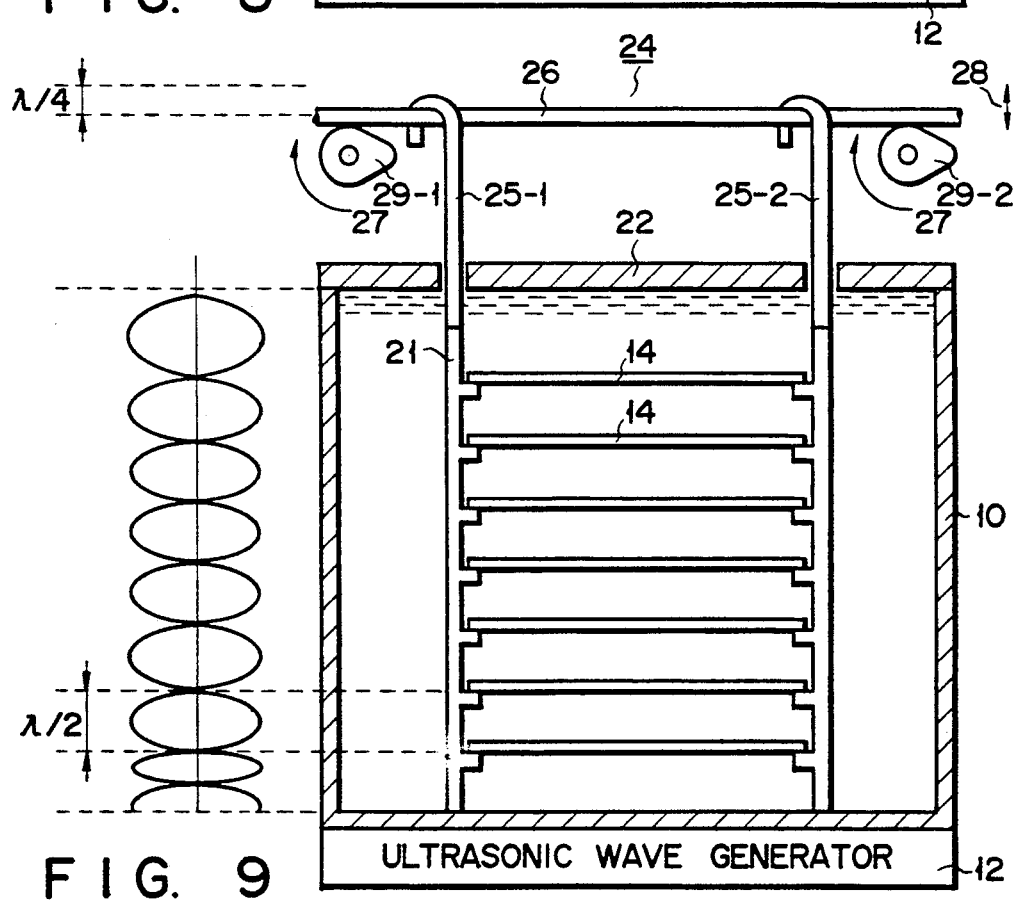
FIG. 9 is a front view of a fourth constructional example of a treatment device used to effect the processing method shown in FIG. 1.

FIG. 9 is a front view of a fourth constructional example of a treatment device which has shaking mechanism 24 for moving wafers 14 up and down in addition to the treatment device of FIG. 8. Shaking mechanism 24 includes lifting members 25-1 and 25-2 for lifting wafer carrier 21, supporting member 26 for supporting lifting members 25-1 and 25-2, and cams 29-1 and 29-2 which are rotated in a direction indicated by arrow 27 to vertically (in a direction of arrow 28) move supporting member 26. The range of supporting member 26 to be vertically moved by cams 29-1 and 29-2 is preferably set to be ¼ of period λ of the ultrasonic waves.

Use of shaking mechanism 24 makes it possible to form damages uniformly on wafers 14 in comparison with the treatment device of FIG. 8.

FIG. 10 is a front view of a fifth constructional example of a treatment device used to effect STEP 3 of the processing method shown in FIG. 1. In the treatment device, wafer carrier 15 in which a plurality of wafers 14 are arranged is enclosed with spherical lid 23 of stainless steel, for example, in treatment bath 10. With this construction, the ultrasonic wave are reflected on lid 23 and efficiently applied to wafers 14.

In the treatment devices described above, both surfaces of the wafer are cleaned and at the same time gettering damages are formed on both surfaces of the wafer in order to effect the cleaning and damage formation process (STEP 3). However, it is possible to clean the back side surface of each wafer and at the same time form damages only on the back side surface.

Figure 11A:
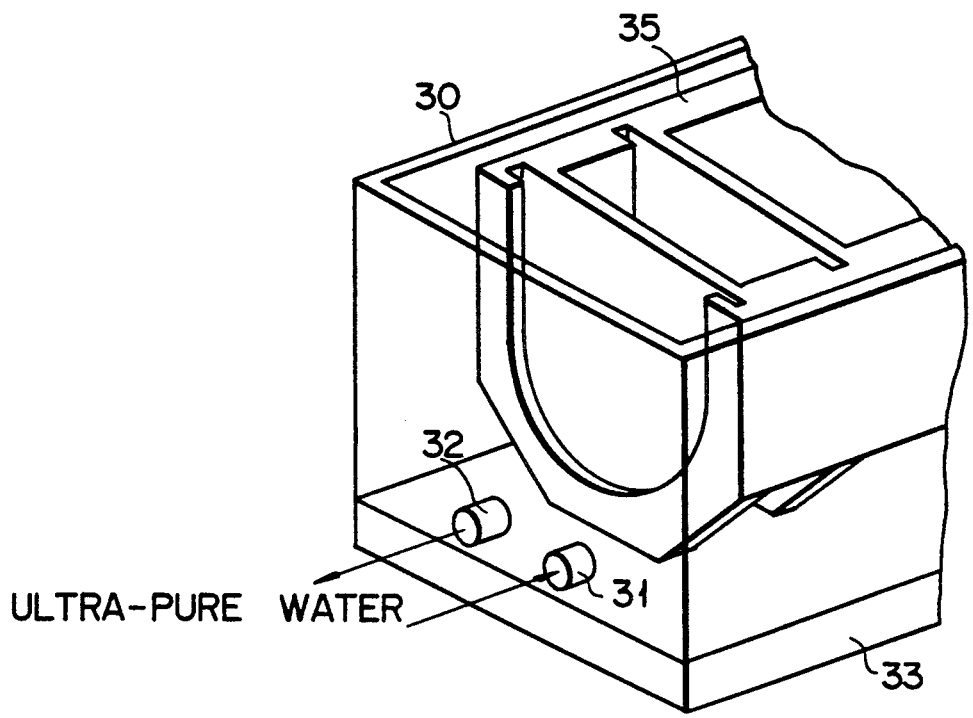
FIG. 11A is a front view of a sixth constructional example of a treatment device used to effect the processing method shown in FIG. 1.
Figure 11B:
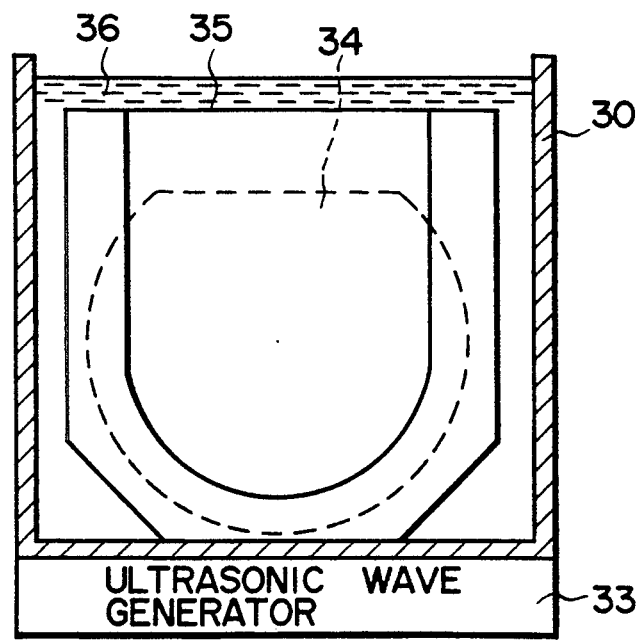
FIG. 11B is a side view of the treatment device shown in FIG. 11A.

FIGS. 11A and 11B show a sixth constructional example of a treatment device used to clean only the back side surface of the wafers and form damages only on the back side surface in order to effect STEP 3 in the processing method shown in FIG. 1. FIG. 11A is a perspective view, FIG. 11B is a side view, and FIG. 11A perspectively shows treatment bath 30 in order to clearly illustrate the internal structure. Supply port 31 and discharging port 32 are provided in the bottom portion of treatment bath 30, and ultra-pure water 36 is supplied into treatment bath 30 via supply port 31 and ultra-pure water 36 overflowing from treatment bath 30 is discharged via discharging port 32. Further, ultrasonic wave generator 33 including an ultrasonic wave oscillator and an ultrasonic wave diaphragm is disposed on the bottom portion of treatment bath 30, and ultrasonic wave generated from generator 33 propagate in ultra-pure water 36 in treatment bath 30. Further, wafer carrier 35 in which a plurality of wafers 34 are vertically disposed is placed in treatment bath 30.

When wafers 34 are inserted into wafer carrier 35, the main surfaces of wafers 34 are brought into contact with the walls of wafer carrier 35, thus preventing ultra-pure water for transmitting ultrasonic wave from being entered therebetween. Therefore, with this treatment device, only the back side surface of each wafer 34 can be cleaned and damages are formed only on the back side surface.

Figure 12A:
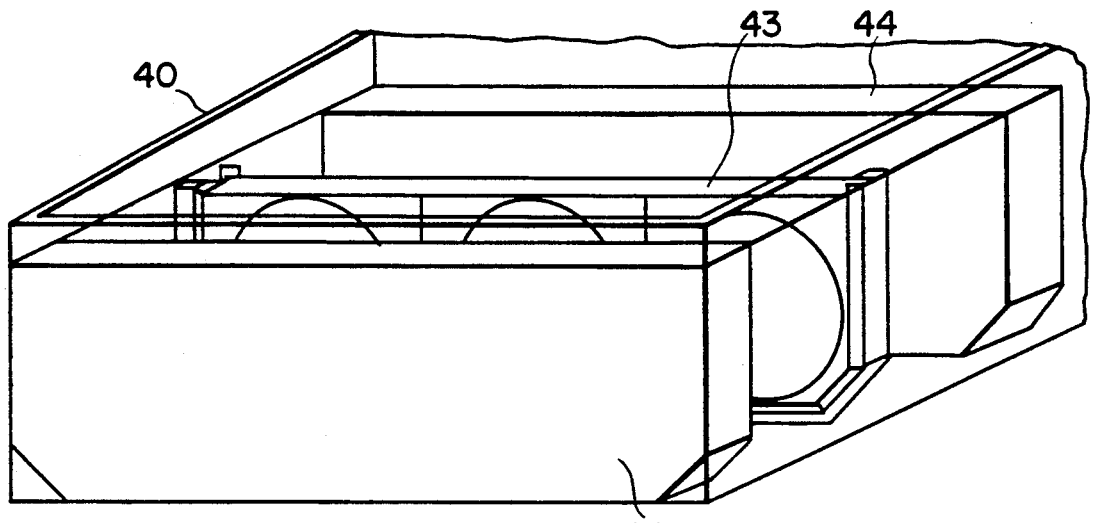
FIG. 12A is a front view of a seventh constructional example of a treatment device used to effect the processing method shown in FIG. 1.
Figure 12B:
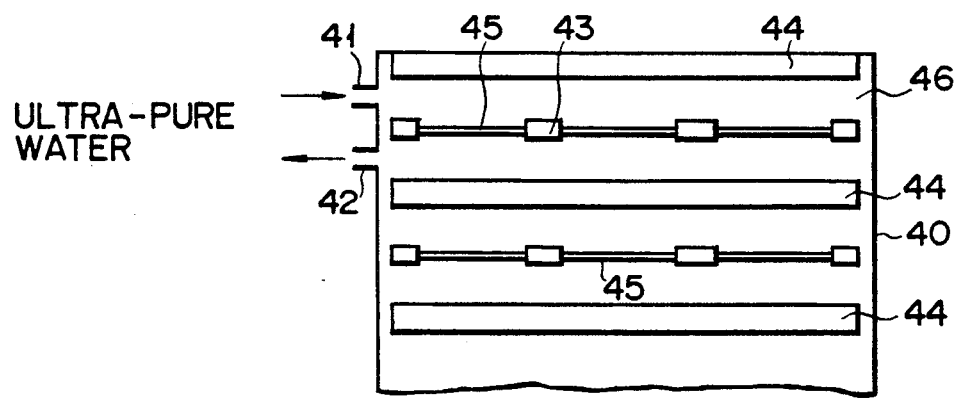
FIG. 12B is a top plan view of the treatment device shown in FIG. 12A.
Figure 12C:
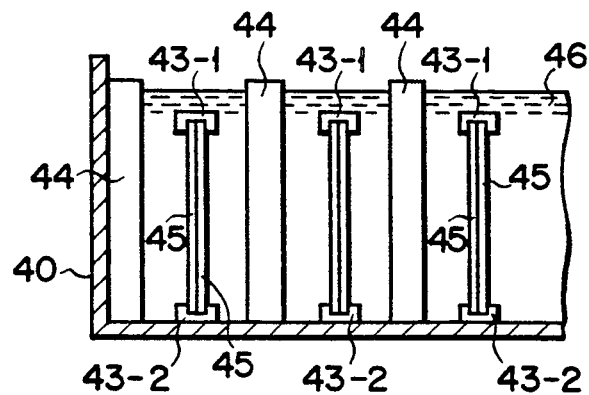
FIG. 12C is a side view of the treatment device shown in FIG. 12A.

FIGS. 12A to 12C show a seventh constructional example of a treatment device used to clean only the back side surface of the wafers and form damages only on the back side surface in order to effect STEP 3 in the processing method shown in FIG. 1. FIG. 12A is a perspective view, FIG. 12B is a top plan view and FIG. 11C is a side view, and FIG. 12A perspectively shows treatment bath 40 in order to clearly illustrate the internal structure as in the case of FIG. 11A. FIG. 12C shows treatment bath 40 which is partly cut away. With this construction, ultra-pure water 46 is supplied into treatment bath 40 via supply port 41 and ultra-pure water 46 overflowing from bath 40 is discharged via discharging port 42. Further, wafer carriers 43 each of which holds a plurality of wafers 45 in a vertical condition are placed in treatment bath 40. Further, ultrasonic wave generators 44 each including an ultrasonic wave oscillator and an ultrasonic wave diaphragm are disposed between wafer carriers 43 and on the side wall of treatment bath 40, and ultrasonic waves generated from generators 44 propagate in ultra-pure water 46 in bath 40.

Two wafers 45 are inserted into each wafer carrier 43 with the main surfaces thereof set in contact with each other. Each wafer carrier 43 is divided into upper carrier 43-1 and lower carrier 43-2. After two wafers 45 are inserted into lower carrier 43-2, upper carrier 43-1 is mounted to cover only the peripheral portions of each wafer.

In a case where the treatment device is used to process the wafers, ultra-pure water 46 which propagates ultrasonic wave will not come into contact with the main surfaces of wafers 45, thereby preventing formation of damages. Thus, only the back side surfaces of the wafers are cleaned and fine damages are formed only on the back side surfaces.

This invention is not limited to the embodiments described above, and it is possible to make various modifications. For example, in the above treatment device, ultra-pure water is used as treatment solution for propagating ultrasonic waves to effect the step of wafer cleaning and damage forming operation. However, it is possible to use ultra-pure acid solution or organic solution instead of ultra-pure water.

Further, as shown in FIG. 13, it is possible to effect a step of polishing the wafer surface into mirror finish by mechanical or chemical processing before effecting the cleaning and damage-forming step (STEP 3) shown in FIG. 1. That is, in the processing method according to the second embodiment, silicon monocrystalline ingot is first cut into slices to obtain wafers (STEP 1). Then, both surfaces of the wafer are subjected to lapping and etching process (STEP 2) in order to eliminate damages caused in the slicing process. Next, the wafer surface is processed to make a mirror finish by mechanical or chemical method (STEP 3). After this, ultrasonic wave are propagated via treatment solution or ultra-pure water and applied to the wafer surface to clean the wafer surface and forming damages on the wafer surface (STEP 4). Finally, the main surface of the wafer which has been subjected to cleaning and damage formation process is polished into a mirror finish (STEP 5).

In this processing method, the same effect as that obtained in the first embodiment of FIG. 1 can be obtained.

As described above, according to this invention, a wafer processing method can be obtained in which fine gettering damages can be formed on the back side surface, thus giving no influence on the succeeding process and the process can be simplified in comparison with the conventional method.

What is claimed is:

1. A wafer processing method comprising the steps of:
    forming wafers by cutting a semiconductor monocrystalline ingot into slices;
    subjecting back side and main surfaces of said wafer to lapping and etching processes; and
    submerging said wafer in substantially pure water and applying ultrasonic waves to the wafer surface via the water, to clean at least one of the surfaces of said back side wafer and to form gettering damage on at least said wafer surface.

2. A wafer processing method according to claim 1, wherein said semiconductor monocrystalline ingot includes silicon monocrystalline ingot.

3. A wafer processing method according to claim 1, wherein the frequency of said ultrasonic waves is in the range of 10 KHz to 100 KHz and the output power of said ultrasonic waves is in the range of 50W to 500W.

4. A wafer processing method according to claim 1, further comprising a step of polishing the main surface of said wafer to a mirror finish after completion of said step of cleaning at least one of the surfaces of said wafer and forming damage on at least said back side wafer surface.

5. A wafer processing method according to claim 1, further comprising a step of mechanically or chemically polishing said main wafer surface to a mirror finish before said step of cleaning at least one of the surfaces of said wafer and forming damage on at least said back side wafer surface.

6. A wafer processing method according to claim 1, further comprising a step of cleaning at least one of the surfaces of said wafer and forming damage on at least said back side wafer surface is effected under a condition that a plurality of wafers are placed at respective nodes of a standing wave of said ultrasonic waves and in parallel with an oscillatory wave front of said ultrasonic waves.

7. A wafer processing method according to claim 6, wherein said plurality of wafers are shaken in a direction perpendicular to the oscillatory wave front of said ultrasonic waves.

8. A wafer processing method according to claim 7, wherein the shaking range of said wafers is set less than ¼ of the wave length of said ultrasonic waves.

9. A wafer processing method according to claim 1, wherein said step of cleaning at least one of the surfaces of said wafer and forming damage on at least said back side wafer surface is effected under a condition that a support having openings is placed in a treatment bath filled with substantially pure water, said wafers are submerged in said treatment bath above said support, and the ultrasonic waves are applied to said wafers via openings in said support.

10. A wafer processing method according to claim 1, wherein said step of cleaning at least one of the surfaces of said wafer and forming damage on at least said back side wafer surface is effected under a condition that said wafers are submerged into a treatment bath filled with substantially pure water and a reflection plate for reflecting ultrasonic waves is used as a lid to cover said treatment bath.

11. A wafer processing method according to claim 1, wherein said step of cleaning at least one of the surfaces of said wafer and forming damage on at least said back side wafer surface is effected under a condition that said wafers are submerged into a treatment bath filled with substantially pure water and a lid formed of material for reflecting ultrasonic waves is used to cover said treatment bath.

12. A wafer processing method according to claim 1, wherein said step of cleaning at least one of the surfaces of said wafer and forming damage on at least said back side wafer surface is effected under a condition that only the back side surfaces of said wafers are placed in contact with the substantially pure water.

13. A wafer processing method according to claim 1, wherein said wafers are placed in a wafer carrier and submerged into the substantially pure water with the main surfaces of said wafers made to contact a wall portion of said wafer carrier.

14. A wafer processing method according to claim 1, wherein said wafers are submerged into substantially pure water and the main surfaces of adjacent two of said wafers are made in contact with each other.

* * * * *